(12) United States Patent
Lee et al.

(10) Patent No.: US 9,155,192 B2
(45) Date of Patent: Oct. 6, 2015

(54) ELECTRONIC COMPONENT PACKAGE

(71) Applicant: SAMSUNG ELECTRO-MECHANICS CO., LTD., Suwon (KR)

(72) Inventors: Kyung Ho Lee, Suwon (KR); Seung Wan Woo, Suwon (KR); Po Chul Kim, Anyang (KR); Young Nam Hwang, Suwon (KR); Suk Jin Ham, Seoul (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 12 days.

(21) Appl. No.: 14/051,019

(22) Filed: Oct. 10, 2013

(65) Prior Publication Data
US 2014/0146498 A1    May 29, 2014

(30) Foreign Application Priority Data

Nov. 29, 2012  (KR) .................. 10-2012-0137049

(51) Int. Cl.
| | |
|---|---|
| *B32B 3/00* | (2006.01) |
| *H05K 1/02* | (2006.01) |
| *H05K 3/28* | (2006.01) |
| *H01L 23/00* | (2006.01) |
| *H01L 23/06* | (2006.01) |
| *H01L 23/16* | (2006.01) |
| *H05K 3/34* | (2006.01) |
| *H01L 23/31* | (2006.01) |

(52) U.S. Cl.
CPC ............ *H05K 1/0271* (2013.01); *H01L 23/562* (2013.01); *H05K 3/285* (2013.01); *H01L 23/06* (2013.01); *H01L 23/16* (2013.01); *H01L 23/3171* (2013.01); *H01L 2924/3511* (2013.01); *H05K 3/3431* (2013.01); *H05K 2201/0175* (2013.01); *H05K 2201/0191* (2013.01); *H05K 2201/068* (2013.01); *H05K 2203/1327* (2013.01)

(58) Field of Classification Search
CPC ......... H01L 23/02; H01L 23/06; H01L 23/16; H01L 23/26
See application file for complete search history.

(56) References Cited

U.S. PATENT DOCUMENTS

2014/0210111 A1* 7/2014 Chung .......................... 257/782

FOREIGN PATENT DOCUMENTS

| KR | 10-2011-0076604 | 7/2011 |
| KR | 10-2012-0007840 | 1/2012 |

* cited by examiner

*Primary Examiner* — Elizabeth Mulvaney
(74) *Attorney, Agent, or Firm* — NSIP Law

(57) ABSTRACT

Disclosed herein is an electronic component package including: a connection member provided on at least one surface of a substrate; an active element coupled to the substrate by the connection member; a molding part covering an exposed surface of the active element; and an additional layer formed on an exposed surface of the molding part to decrease a warpage phenomenon. In the electronic component package, the warpage phenomenon may be decreased as compared with the related art.

10 Claims, 3 Drawing Sheets

COEFFICIENT OF THERMAL EXPANSION OF UPPER LAYER <
COEFFICIENT OF THERMAL EXPANSION OF LOWER LAYER

COEFFICIENT OF THERMAL EXPANSION OF UPPER LAYER >
COEFFICIENT OF THERMAL EXPANSION OF LOWER LAYER

ELECTRONIC COMPONENT PACKAGE

CROSS REFERENCE(S) TO RELATED APPLICATIONS

This application claims the benefit under 35 U.S.C. Section 119 of Korean Patent Application Serial No. 10-2012-0137049, entitled "Electronic Component Package" filed on Nov. 29, 2012, which is hereby incorporated by reference in its entirety into this application.

BACKGROUND OF THE INVENTION

1. Technical Field

The present invention relates to an electronic component package.

2. Description of the Related Art

Recently, miniaturization and lightness of a portable electronic product such as a smart phone have been continuously conducted. Therefore, miniaturization and lightness of electronic components mounted in the portable electronic product have also been conducted.

Meanwhile, as a function of each of the electronic components has been improved and a size thereof has continuously decreased, the case of packaging the electronic component in order to protect the electronic component and increase efficiency of a manufacturing process has been increased.

As an example, in Patent Documents 1, 2, or the like, a technology related to a package on package (POP) has been introduced. Particularly, in Patent Document 1, the case of implementing a molding part using an epoxy molding compound (EMC) has been introduced.

Meanwhile, in accordance with the trend toward slimness of various electronic devices, thicknesses of a substrate, a molding part, and the like, have been continuously decreased. However, in the case of implementing the molding part using the EMC as in Patent Document 1, as an electronic component package is slimmed, a warpage phenomenon in a high temperature environment is intensified.

This warpage phenomenon causes serious problems such as deterioration of connectivity, generation of a crack at a contact portion, and the like, when an electronic component package is connected to other devices.

RELATED ART DOCUMENT

Patent Document (Patent Document 1) Korean Patent Laid-Open Publication No. 2012-0007840
(Patent Document 2) Korean Patent Laid-Open Publication No. 2011-0076604

SUMMARY OF THE INVENTION

An object of the present invention is to provide an electronic component package capable of decreasing warpage by including an additional layer disposed on a surface of a molding part or a surface of an active element.

According to an exemplary embodiment of the present invention, there is provided an electronic component package including: a connection member provided on at least one surface of a substrate; an active element coupled to the substrate by the connection member; a molding part covering an exposed surface of the active element; and an additional layer formed on an exposed surface of the molding part to decrease a warpage phenomenon.

The electronic component package may have a warpage value of 0 or less, and the additional layer may be made of a material having a coefficient of thermal expansion of $15 \times 10^{-6}/°C$. or more.

The additional layer may be made of a material having a coefficient of thermal expansion of $20 \times 10^{-6}/°C$. or more and have a thickness of 0.01 to 0.3 mm.

The electronic component package may have a warpage value of 0 or more, and the additional layer may be made of a material having a coefficient of thermal expansion less than $15 \times 10^{-6}/°C$.

The additional layer may be made of a material having a coefficient of thermal expansion less than $10 \times 10^{-6}/°C$. and have a thickness of 0.01 to 0.3 mm.

The additional layer may be made of a material including silicon dioxide ($SiO_2$).

According to another exemplary embodiment of the present invention, there is provided an electronic component package including: a connection member provided on at least one surface of a substrate; an active element coupled to the substrate by the connection member; and an additional layer formed on an exposed surface of the active element to decrease a warpage phenomenon.

DESCRIPTION OF THE PREFERRED EMBODIMENTS

Figure 1:
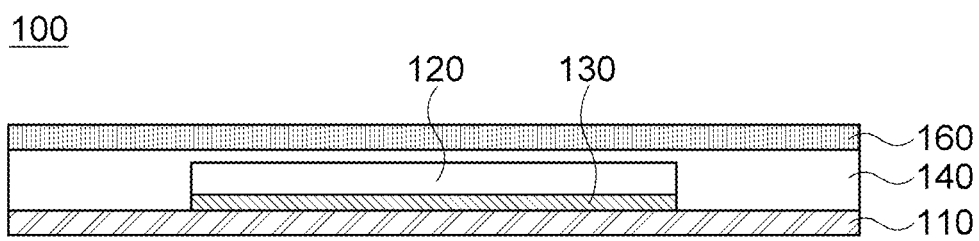
FIG. 1 is a cross-sectional view schematically showing an electronic component package according to an exemplary embodiment of the present invention.

Various advantages and features of the present invention and methods accomplishing thereof will become apparent from the following description of exemplary embodiments with reference to the accompanying drawings. However, the present invention may be modified in many different forms and it should not be limited to exemplary embodiments set forth herein. These exemplary embodiments may be provided so that this disclosure will be thorough and complete, and will fully convey the scope of the invention to those skilled in the art. Like reference numerals throughout the description denote like elements.

Terms used in the present specification are for explaining exemplary embodiments rather than limiting the present invention. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

For simplification and clearness of illustration, a general configuration scheme will be shown in the accompanying drawings, and a detailed description of the feature and the technology well known in the art will be omitted in order to prevent a discussion of exemplary embodiments of the present invention from being unnecessarily obscure. Additionally, components shown in the accompanying drawings are not necessarily shown to scale. For example, sizes of some components shown in the accompanying drawings may be exaggerated as compared with other components in order to assist in understanding of exemplary embodiments of the present invention. Like reference numerals on different drawings will denote like components, and similar reference numerals on different drawings will denote similar components, but are not necessarily limited thereto.

In the specification and the claims, terms such as "first", "second", "third", "fourth" and the like, if any, will be used to distinguish similar components from each other and be used to describe a specific sequence or a generation sequence, but is not necessarily limited thereto. It may be understood that these terms are compatible with each other under an appropriate environment so that exemplary embodiments of the present invention to be described below may be operated in a sequence different from a sequence shown or described herein. Likewise, in the present specification, in the case in which it is described that a method includes a series of steps, a sequence of these steps suggested herein is not necessarily a sequence in which these steps may be executed. That is, any described step may be omitted and/or any other step that is not described herein may be added to the method.

In the specification and the claims, terms such as "left", "right", "front", "rear", "top", "bottom", "over", "under", and the like, if any, do not necessarily indicate relative positions that are not changed, but are used for description. It may be understood that these terms are compatible with each other under an appropriate environment so that exemplary embodiments of the present invention to be described below may be operated in a direction different from a direction shown or described herein. A term "connected" used herein is defined as being directly or indirectly connected in an electrical or non-electrical scheme. Targets described as being "adjacent to" each other may physically contact each other, be close to each other, or be in the same general range or region, in the context in which the above phrase is used. Here, a phrase "in an exemplary embodiment" means the same exemplary embodiment, but is not necessarily limited thereto.

Hereinafter, a configuration and an acting effect of exemplary embodiments of the present invention will be described in more detail with reference to the accompanying drawings.

FIG. 1 is a cross-sectional view schematically showing an electronic component package 100 according to an exemplary embodiment of the present invention.

Referring to FIG. 1, the electronic component package 100 according to the exemplary embodiment of the present invention may include a substrate 110, a connection member 130, an active element 120, a molding part 140, and an additional layer 160.

The substrate 110 may be implemented as a general printed circuit board (PCB), or the like.

The active element 120 may be various active elements such as an integrated circuit (IC), or the like.

The connection member 130 may be implemented using a synthetic resin such as epoxy, or the like, or various conductive solders, and serve to electrically and physically connect between the active element 120 and the substrate 110.

The molding part 140 may cover an exposed surface of the active element 120 to serve to protect the active element 120.

The additional layer 160 may be formed on the exposed surface of the molding part 140 and serve to decrease a warpage phenomenon generated due to a difference in a coefficient of thermal expansion (CTE) among the substrate 110, the active element 120, and the molding part 140.

Here, a warpage degree of the substrate 110 is also called warpage.

Figure 2:
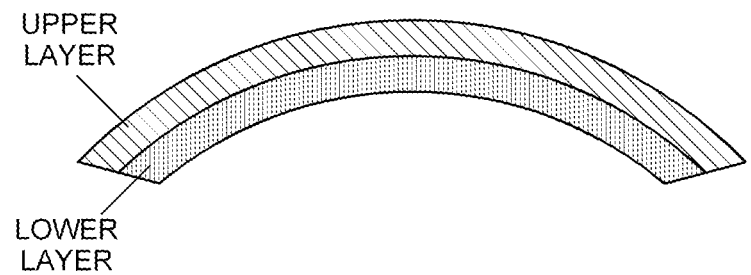
FIG. 2 is a view describing a principle of warpage generation.
Figure 3:
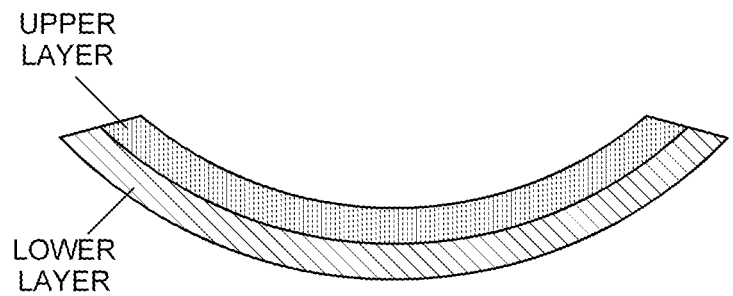
FIG. 3 is a view describing a principle of warpage generation.

FIGS. 2 and 3 are views describing a principle of warpage generation.

Generally, in the electronic component package, the substrate 110, the active element 120, the molding part 140, and the like, are made of different materials. In this case, a large difference in a coefficient of thermal expansion may be generated according to materials.

In this case, a warpage phenomenon that a package is warped in a process in which a plurality of different layers made of different kinds of materials are coupled to one another at a high temperature and then cooled occurs.

For example, as shown in FIG. 2, in the case in which a coefficient of thermal expansion of an upper layer is smaller than that of a lower layer, since the lower layer is further contracted as compared with the upper layer in a process in which the upper and lower layers are coupled to each other at a high temperature and then cooled, warpage occurs in a shape in which a central portion is upwardly convex. This state is also called a cry mode. In this case, a warpage value may be represented by a negative number.

On the other hand, as shown in FIG. 3, in the case in which the coefficient of thermal expansion of the upper layer is larger than that of the lower layer, since the upper layer is further contracted as compared with the lower layer in a process in which the upper and lower layers are coupled to each other at a high temperature and then cooled, warpage occurs in a shape in which a central portion is downwardly convex. This state is also called a smile mode. In this case, a warpage value may be represented by a positive number.

Even though only conductive patterns are formed on the substrate 110, since coefficients of thermal expansion of a material forming the substrate 110 and materials forming the conductive patterns are different, a warpage phenomenon may occur by a principle similar to the principle described above.

According to the related art, in order to solve a problem due to the warpage phenomenon, selection of a molding material, selection of a substrate material, and pattern design in which copper foil rates of each layer of a substrate are adjusted, and the like, have been utilized. However, since there is a restriction according to standardization, or the like, and there is a limitation in a usable material, there is a limitation in decreasing the warpage.

Particularly, recently, the package including the electronic component tends to be slimmed. Therefore, an amount of molding material cannot but be decreased, such that a factor capable of decreasing the warpage has been gradually decreased.

In this situation, an inventor of the present invention has developed the electronic component package 100 including the additional layer 160 so as to solve the problems according to the related art.

Materials used in order to manufacture a general electronic component package and features thereof are represented by the following Table 1.

TABLE 1

| Division | Modulus (GPa) | CTE(/° C.) | Thickness (mm) |
|---|---|---|---|
| Molding part (EMC) | 4~15 | $5 \times 10^{-6}$ to $50 \times 10^{-6}$ | 0.01~0.5 |
| Active element | 127 | $3.6 \times 10^{-6}$ | 0.05~0.3 |
| Substrate | 10~40 | $12 \times 10^{-6}$ to $30 \times 10^{-6}$ | 0.1~0.5 |

As a result obtained by designing samples while changing characteristic values of materials according to the above Table 1 and simulating warpage values for the designed samples, it was confirmed that warpage of −0.737 to 0.518 mm has been generated.

In this case, in order to perform a precise simulation, the samples were designed using an orthogonal array $L_{81}(3^{40})$.

Meanwhile, in the case in which the warpage value is a negative number, it means a cry mode, and in the case in which the warpage value is a positive number, it means a smile mode.

In addition, a combination in which the warpage become the maximum in the cry mode, that is, a combination in which the warpage value is −0.737 was confirmed as shown in the following Table 2.

TABLE 2

| Division | Modulus (GPa) | CTE(/° C.) | Thickness (mm) |
|---|---|---|---|
| Molding part | 9.5 | $27.5 \times 10^{-6}$ | 0.01 |
| Active element | 127 | $3.6 \times 10^{-6}$ | 0.05 |
| Substrate | 40 | $30 \times 10^{-6}$ | 0.1 |

In addition, a combination in which the warpage become the maximum in the smile mode, that is, a combination in which the warpage value is 0.518 was confirmed as shown in the following Table 3.

TABLE 3

| Division | Modulus (GPa) | CTE(/° C.) | Thickness (mm) |
|---|---|---|---|
| Molding part | 9.5 | $50 \times 10^{-6}$ | 0.5 |
| Active element | 127 | $3.6 \times 10^{-6}$ | 0.05 |
| Substrate | 25 | $21 \times 10^{-6}$ | 0.1 |

Figure 4:
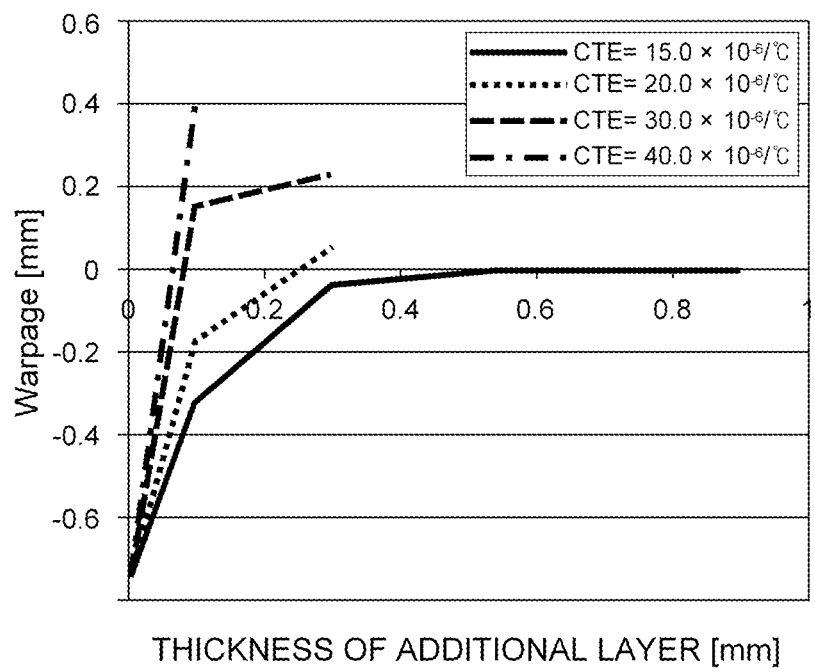
FIG. 4 is a graph showing a correlation between a coefficient of thermal expansion and a thickness of an additional layer and warpage in the electronic component package according to the exemplary embodiment of the present invention.

FIG. 4 is a graph showing a correlation between a coefficient of thermal expansion and a thickness of an additional layer 160 and warpage in the electronic component package 100 according to the exemplary embodiment of the present invention.

For example, FIG. 4 shows a result obtained by simulating a warpage value while applying materials and thicknesses of the substrate 110, the active element 120, and the molding part 140 under conditions represented by Table 2 and changing a coefficient of thermal expansion and a thickness of the additional layer 160.

Referring to FIG. 4, it may be understood that when the additional layer 160 is implemented using a material having a coefficient of thermal expansion of $15 \times 10^{-6}$/° C. or more, an absolute value of warpage is decreased.

In addition, when the coefficients of thermal expansion of materials implementing the additional layer 160 are the same as each other, the thicker the thickness of the additional layer 160, the lower the absolute value of the warpage.

Meanwhile, in the case of forming the additional layer 160 at a thicker thickness using a material having a larger coefficient of thermal expansion in order to decrease an absolute value of warpage in the cry mode, an absolute value of warpage in the smile mode may be increased.

In addition, an increase in the thickness of the additional layer 160 may have a negative effect on slimness of the electronic component package 100.

In consideration of these features, it is preferable that the additional layer 160 is implemented using a material having a coefficient of thermal expansion of $20 \times 10^{-6}$/° C. or more and has a thickness in a range of 0.01 to 0.3 mm.

Figure 5:
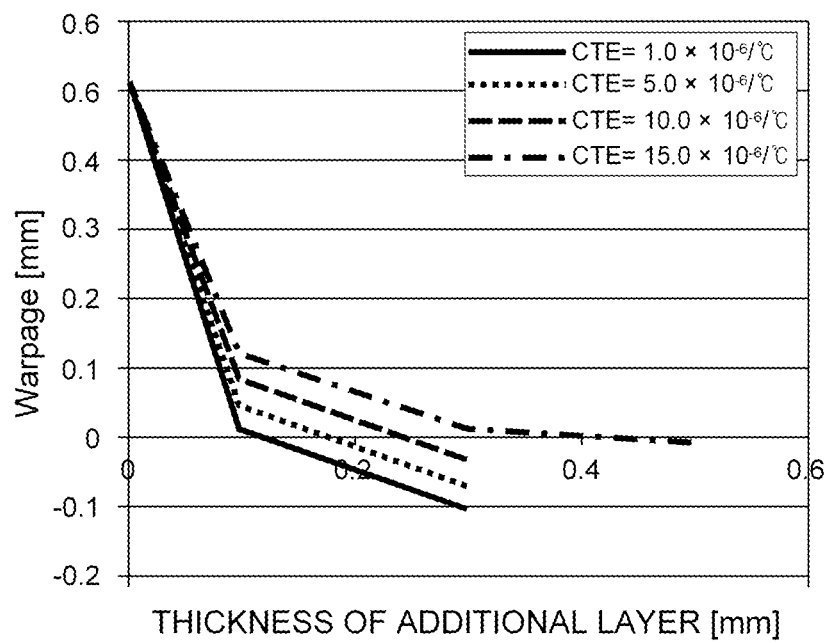
FIG. 5 is a graph showing a correlation between a coefficient of thermal expansion and a thickness of an additional layer and warpage in the electronic component package according to the exemplary embodiment of the present invention.

FIG. 5 is a graph showing a correlation between a coefficient of thermal expansion and a thickness of an additional layer 160 and warpage in the electronic component package 100 according to another exemplary embodiment of the present invention.

For example, FIG. 5 shows a result obtained by simulating a warpage value while applying materials and thicknesses of the substrate 110, the active element 120, and the molding part 140 under conditions represented by Table 3 and changing a coefficient of thermal expansion and a thickness of the additional layer 160.

Referring to FIG. 5, it may be understood that when the additional layer 160 is implemented using a material having a coefficient of thermal expansion less than $15 \times 10^{-6}$/° C., an absolute value of warpage is decreased.

In addition, when the coefficients of thermal expansion of materials implementing the additional layer 160 are the same as each other, the thicker the thickness of the additional layer 160, the lower the absolute value of the warpage.

Meanwhile, in the case of forming the additional layer 160 at a thicker thickness using a material having a larger coefficient of thermal expansion in order to decrease warpage in the smile mode, warpage in the cry mode may be increased.

In addition, an increase in the thickness of the additional layer 160 may have a negative effect on slimness of the electronic component package 100.

In consideration of these features, it is preferable that the additional layer 160 is implemented using a material having a coefficient of thermal expansion less than $10 \times 10^{-6}$/° C. and has a thickness in a range of 0.01 to 0.3 mm.

Here, silicon dioxide ($SiO_2$) may be included in a material implementing the additional layer 160.

The silicon dioxide, which is a material having a coefficient of thermal expansion of $8 \times 10^{-6}$/° C., may be efficiently disposed on an exposed surface of the molding part 140 by a method such as a coating method, or the like.

Figure 6:
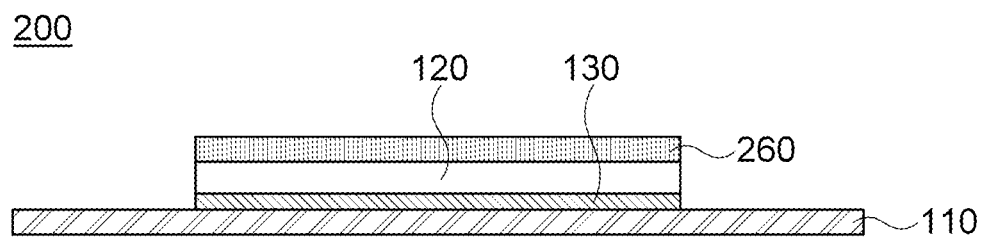
FIG. 6 is a cross-sectional view schematically showing an electronic component package according to another exemplary embodiment of the present invention.

FIG. 6 is a cross-sectional view schematically showing an electronic component package 200 according to another exemplary embodiment of the present invention.

Referring to FIG. 6, the electronic component package 200 according to another exemplary embodiment of the present invention may include a substrate 110, a connection member 130, an active element 120, and an additional layer 260.

Unlike the electronic component package 100 according to the exemplary embodiment of the present invention described with reference to FIG. 1, in the electronic component package 200 according to the present embodiment, the additional layer 260 is directly provided on a surface of the active element 120 in a state in which a molding part is not formed on the surface of the active element 120.

That is, the additional layer 260 is directly provided on the surface of the active layer 120, thereby making it possible to decrease the warpage.

Since other features are similar to those of the above-mentioned exemplary embodiment, an overlapped description will be omitted.

In the electronic component package according to the exemplary embodiment of the present invention configured as described above, the warpage phenomenon is decreased as compared with the related art, such that manufacturing efficiency and reliability may be improved.

What is claimed is:

1. An electronic component package comprising:
   a connection member provided on at least one surface of a substrate;
   an active element coupled to the substrate by the connection member;
   a molding part covering an exposed surface of the active element; and
   an additional layer formed on an exposed surface of the molding part to decrease a warpage phenomenon,
   the electronic component package having a warpage value of 0 or less, and
   the additional layer being made of a material having a coefficient of thermal expansion of $15 \times 10^{-6}/°$ C. or more.

2. The electronic component package according to claim 1, wherein the additional layer is made of a material having a coefficient of thermal expansion of $20 \times 10^{-6}/°$ C. or more and has a thickness of 0.01 to 0.3 mm.

3. An electronic component package comprising:
   a connection member provided on at least one surface of a substrate;
   an active element coupled to the substrate by the connection member;
   a molding part covering an exposed surface of the active element; and
   an additional layer formed on an exposed surface of the molding part to decrease a warpage phenomenon,
   the electronic component package having a warpage value of 0 or more, and
   the additional layer being made of a material having a coefficient of thermal expansion less than $15 \times 10^{-6}/°$ C.

4. The electronic component package according to claim 3, wherein the additional layer is made of a material having a coefficient of thermal expansion less than $10 \times 10^{-6}/°$ C. and has a thickness of 0.01 to 0.3 mm.

5. The electronic component package according to claim 4, wherein the additional layer is made of a material including silicon dioxide ($SiO_2$).

6. An electronic component package comprising:
   a connection member provided on at least one surface of a substrate;
   an active element coupled to the substrate by the connection member; and
   an additional layer formed on an exposed surface of the active element to decrease a warpage phenomenon,
   the electronic component package having a warpage value of 0 or less, and
   the additional layer being made of a material having a coefficient of thermal expansion of $15 \times 10^{-6}/°$ C. or more.

7. The electronic component package according to claim 6, wherein the additional layer is made of a material having a coefficient of thermal expansion of $20 \times 10^{-6}/°$ C. or more and has a thickness of 0.01 to 0.3 mm.

8. An electronic component package comprising:
   a connection member provided on at least one surface of a substrate;
   an active element coupled to the substrate by the connection member; and
   an additional layer formed on an exposed surface of the active element to decrease a warpage phenomenon,
   the electronic component package having a warpage value of 0 or more, and
   the additional layer being made of a material having a coefficient of thermal expansion less than $15 \times 10^{-6}/°$ C.

9. The electronic component package according to claim 8, wherein the additional layer is made of a material having a coefficient of thermal expansion less than $10 \times 10^{-6}/°$ C. and has a thickness of 0.01 to 0.3 mm.

10. The electronic component package according to claim 9, wherein the additional layer is made of a material including silicon dioxide ($SiO_2$).

* * * * *